(12) United States Patent
Kim

(10) Patent No.: US 7,554,405 B2
(45) Date of Patent: Jun. 30, 2009

(54) ADAPTIVE BIASING INPUT STAGE AND AMPLIFIERS INCLUDING THE SAME

(75) Inventor: Hyoung-Rae Kim, Hwasung (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 68 days.

(21) Appl. No.: 11/975,103

(22) Filed: Oct. 17, 2007

(65) Prior Publication Data

US 2008/0272846 A1 Nov. 6, 2008

(30) Foreign Application Priority Data

May 2, 2007 (KR) ...................... 10-2007-0042819
Jul. 31, 2007 (KR) ...................... 10-2007-0076963

(51) Int. Cl.
*H03F 3/45* (2006.01)
(52) U.S. Cl. ...................... 330/261; 330/257
(58) Field of Classification Search ................. 330/261, 330/257, 253, 258
See application file for complete search history.

(56) References Cited

U.S. PATENT DOCUMENTS

| | | | | |
|---|---|---|---|---|
| 6,300,834 B1 * | 10/2001 | Lin | ............. | 330/257 |
| 6,642,789 B2 * | 11/2003 | Ivanov et al. | ............. | 330/253 |
| 6,919,766 B2 * | 7/2005 | Suzuki | ............. | 330/252 |
| 7,330,074 B2 * | 2/2008 | Kang et al. | ............. | 330/255 |
| 2004/0124921 A1 | 7/2004 | Burt | | |
| 2005/0035822 A1 | 2/2005 | Ruck | | |
| 2005/0206451 A1 | 9/2005 | Ricotti | | |
| 2006/0012429 A1 | 1/2006 | Kim | | |

OTHER PUBLICATIONS

Korean Patent Application No. 1020020050863 to Kwon, having Publication date of Mar. 4, 2004 (w/ Engish Abstract page).
Korean Patent Application No. 1020040072174 to Kim, having Publication date of Mar. 14, 2006 (w/ Engish Abstract page).
Korean Patent Application No. 1020060003023 to Makoto, having Publication date of Feb. 6, 2006 (w/ English Abstract page).
Japanese Patent Application No. 2000-230498 to Hisao, having Publication date of Feb. 8, 2002 (w/ Engish Abstract page).
Japanese Patent Application No. 2000-261989 to Yasuyuki et al., having Publication date of Jun. 8, 2001 (w/ Engish Abstract page).
"Adaptive Biasing CMOS Amplifier" to DeGrauwe et al., IEEE Journal of Solid-State Circuits, vol. SC-17, No. 3, Jun. 1982.
"A Very-High-Slew-Rate CMOS Operational Amplifier" to Klinke et al., IEEE Journal of Solid-State Circuits, vol. 24, No. 3, Jun. 1989.

(Continued)

*Primary Examiner*—Henry K Choe
(74) *Attorney, Agent, or Firm*—Monica H. Choi

(57) ABSTRACT

An adaptive biasing input stage includes pairs of differentially coupled amplifying and sensing field effect transistors having gates with differential inputs applied thereon. In addition, a static current source is coupled to sources of the amplifying and sensing field effect transistors at a predetermined node. Also, current mirrors are coupled to the sensing field effect transistors for forming loop mechanisms for increasing the current through the predetermined node when the differential inputs have a non-zero difference.

25 Claims, 8 Drawing Sheets

OTHER PUBLICATIONS

"Class AB CMOS Amplifiers with High Efficiency" to Callewaert et al., IEEE Journal of Solid-State Circuits, vol. 25, No. 3, Jun. 1990.

"An Integrated Low-Voltage Class AB CMOS OTA" to Harjani et al., IEEE Journal of Solid-State Circuits, vol. 34, No. 2, Feb. 1999.

"Low-Voltage Super Class AB CMOS OTA Cells with Very High Slew Rate and Power Efficiency" to Lopez-Martin et al., IEEE Journal of Solid-State Circuits, vol. 40, No. 5, May 2005.

* cited by examiner

ADAPTIVE BIASING INPUT STAGE AND AMPLIFIERS INCLUDING THE SAME

CROSS-REFERENCE TO RELATED APPLICATION(S)

The present application claims priority under 35 U.S.C. §119 to Korean Patent Application No. 2007-42819 filed on May 2, 2007 and to Korean Patent Application No. 2007-76963 filed on Jul. 31, 2007, which are incorporated herein by reference in their entirety.

TECHNICAL FIELD

The present invention relates generally to integrated circuit amplifiers, and more particularly, to an adaptive biasing input stage having small area and high current efficiency, and to amplifiers including the same.

BACKGROUND OF THE INVENTION

Analog circuits including analog integrated circuit amplifiers are common components in many electronic devices. As electronic devices are desired to be portable and small, analog integrated circuit amplifiers are desired to be formed with low area and to be operated with low power consumption.

For minimizing current dissipation, an adaptive biasing amplifier increases biasing currents depending on the input. FIG. 1 shows a circuit diagram of a prior art adaptive biasing amplifier 100 as disclosed in Degrauwe et al. "Adaptive Biasing CMOS Amplifier", IEEE Journal of Solid-State Circuits, Vol. SC-17, No. 3, pages 522-528, June 1982.

Referring to FIG. 1, the adaptive biasing amplifier 100 includes NMOSFETs (N-channel metal oxide semiconductor field effect transistors) MN1 and MN2 having gates with inputs Vin− and Vin+ applied thereon, respectively. In addition, diode connected PMOSFETs (P-channel metal oxide semiconductor field effect transistors) MP1 and MP2 are respectively connected to drains of the NMOSFETs MN1 and MN2. The sources of the NMOSFETs MN1 and MN2 are connected to a static current source ISS.

The adaptive biasing amplifier 100 also includes a first pair of NMOSFETs MN3 and MN4 forming a first current mirror, a second pair of NMOSFETs MN5 and MN6 forming a second current mirror, a third pair of NMOSFETs MN7 and MN8 forming a third current mirror, and a fourth pair of NMOSFETs MN9 and MN10 forming a fourth current mirror. The NMOSFETs MN5 and MN6 have area scaling with a ratio of 1:A, respectively, and the NMOSFETs MN7 and MN8 have area scaling with a ration of A:1, respectively.

PMOSFETs MP3 and MP4 have gates connected to the gate of the PMOSFET MP1, and PMOSFETs MP5 and MP6 have gates connected to the gate of the PMOSFET MP2. The PMOSFETs MP3, MP4, MP5, and MP6 are connected to the current mirrors formed by the NMOSFETs MN3, MN4, MN5, MN6, MN7, MN8, MN9, and MN10.

In addition, the PMOSFETs MP3, MP4, MP5, and MP6 have sources connected to a high supply voltage VDD, and the NMOSFETs MN3, MN4, MN5, MN6, MN7, MN8, MN9, and MN10 have sources connected to a low supply voltage VSS which may be the ground voltage. As a difference between the inputs Vin− and Vin+ increases, the NMOSFETs MN3, MN4, MN5, MN6, MN7, MN8, MN9, and MN10 and the PMOSFETs MP3, MP4, MP5, and MP6 increase the respective biasing currents through the MOSFETs MN1, MN2, MP1, and MP2.

The adaptive biasing amplifier 100 has numerous current mirrors formed by the NMOSFETs MN3, MN4, MN5, MN6, MN7, MN8, MN9, and MN10 and numerous static current paths formed by the PMOSFETs MP3, MP4, MP5, and MP6. Such components dissipate relatively high static current resulting in low current efficiency. In addition, the input NMOSFETs MN1 and MN2 have diode-connected loads MP1 and MP2 resulting in low GBW (gain bandwidth).

FIG. 2 shows a circuit diagram of another prior art adaptive biasing amplifier 110 as disclosed in Callewaert et al. "Class AB CMOS Amplifiers with High Efficiency", IEEE Journal of Solid-State Circuits, Vol. 25, No. 6, pages 684-691, June 1990. The adaptive biasing amplifier 110 includes input NMOSFETs MN11 and MN12 and sensing NMOSFETs MN13 and MN14. Such NMOSFETs MN11, MN12, MN13, and MN14 have gates with inputs Vin− and Vin+ applied thereon as illustrated in FIG. 2.

Also in FIG. 2, a first static current source ISS1 is connected to the source of the NMOSFET MN14, and a second static current source ISS2 is connected to the source of the NMOSFET MN13. The adaptive biasing amplifier 110 also includes a pair of NMOSFETs MN15 and MN16 forming a first current mirror and another pair of NMOSFETs MN17 and MN18 forming a second current mirror. The NMOSFETs MN15 and MN16 have area scaling with a ratio of 1:A, respectively, and the NMOSFETs MN17 and MN18 have area scaling with a ratio of A:1, respectively.

A pair of PMOSFETs MP11 and MP12 forms a third current mirror connected between a high supply voltage VDD and the NMOSFETs MN11 and MN14. A pair of PMOSFETs MP13 and MP14 forms a fourth current mirror connected between the high supply voltage VDD and the NMOSFETs MN13 and MN12. A first bias current source Ib1 is connected between the high supply voltage VDD, the drain of the NMOSFET MN11, and a source of a biased PMOSFET MP15. Further referring to FIG. 2, PMOSFETs MP17' and MP18' that are diode-connected and an NMOSFET MN19' are formed for biasing the gate of the PMOSFET MP15. The PMOSFET MP15 has a drain connected to the drain of the NMOSFET MN15.

A second bias current source Ib2 is connected between the high supply voltage VDD, the drain of the NMOSFET MN12, and a source of another biased PMOSFET MP16. A drain of the PMOSFET MP16 is connected to a drain of the NMOSFET MN18. Two diode-connected PMOSFETs MP17 and MP18 are connected between the high supply voltage VDD and an NMOSFET MN19. The gate of the PMOSFET MP16 is connected to the gate of the PMOSFET MP18. The gate of the NMOSFET MN19 is connected to the gate of the NMOSFET MN18. The NMOSFETs MN15, MN16, MN17, MN18, and MN19 have sources connected to a low supply voltage VSS which may be the ground voltage.

As a difference between the input voltages Vin− and Vin+ increases, the components in the adaptive biasing amplifier 110 of FIG. 2 increase the respective biasing currents through the MOSFETs MN11, MN12, MP11, and MP14. In addition, the GBW (gain bandwidth) of the adaptive biasing amplifier 110 of FIG. 2 is improved from the adaptive biasing amplifier 100 of FIG. 1.

However, the first series of diode-connected PMOSFETs MP17 and MP18 and the second series of diode-connected PMOSFETs MP17' and MP18' result in increased operating voltage in the adaptive biasing amplifier 110 that consequently has a limited minimum operating voltage. Lower operating voltage is desired for minimizing power consumption and portability with a lighter battery. In addition, the adaptive biasing amplifier 110 of FIG. 2 includes four current sources ISS1, ISS2, Ib1, and Ib2 that occupy large integrated circuit area.

Thus, adaptive biasing amplifiers are desired to have high GBW (gain bandwidth), minimized area, high current efficiency, and low operating voltage.

SUMMARY OF THE INVENTION

Accordingly, in a general aspect of the present invention, an adaptive biasing input stage is formed with a single static current source and without a series of multiple diode-connected MOSFETs.

An adaptive biasing input stage according to an aspect of the present invention includes a pair of differentially coupled amplifying field effect transistors having gates with differential inputs applied thereon and includes a pair of differentially coupled sensing field effect transistors having gates with the differential inputs applied thereon. The adaptive biasing input stage further includes a static current source coupled between a first power supply node and sources of the amplifying and sensing field effect transistors at a predetermined node. Also, the adaptive biasing input stage includes a first current mirror coupled between one of the sensing field effect transistors and a second power supply node, and includes a second current mirror coupled between the first current mirror, the predetermined node, and the first power supply node.

In an embodiment of the present invention, the sensing field effect transistors and the first and second current mirrors increase a current flowing from the predetermined node when a first differential input applied on such one of the sensing field effect transistors is greater than a second differential input applied on another of the sensing field effect transistors.

In another embodiment of the present invention, the second current mirror includes a first mirror transistor having a first area and being coupled to the first current mirror, and includes a second mirror transistor having a second area that is A-times the first area and being coupled to the predetermined node. In an example embodiment of the present invention, A is between a range of from about 1 to about 2 with A being selected to maximize current efficiency of the adaptive biasing input stage.

In another embodiment of the present invention, the adaptive biasing input stage includes a third current mirror coupled between another of the sensing field effect transistors and the second power supply node, and includes a fourth current mirror coupled between the third current mirror, the predetermined node, and the first power supply node. In that case, the sensing field effect transistors and the third and fourth current mirrors increase a current flowing from the predetermined node when a first differential input applied on the other of the sensing field effect transistors is greater than a second differential input applied on such one of the sensing field effect transistors.

In a further embodiment of the present invention, the fourth current mirror includes a third mirror transistor having a third area and being coupled to the third current mirror, and includes a fourth mirror transistor having a fourth area that is A-times the third area and being coupled to the predetermined node. For example, A is between a range of from about 1 to about 2, with A being selected to maximize current efficiency of the adaptive biasing input stage.

In another embodiment of the present invention, a static current through each field effect transistor of the adaptive biasing input stage increases with A, and a respective dynamic current through each of the amplifying and sensing field effect transistors is a respective quadratic function of a difference between the differential inputs.

In a further embodiment of the present invention, the adaptive biasing input stage further includes load field effect transistors coupled between the amplifying field effect transistors and the second power supply node and being biased by the first and third current mirrors.

The adaptive biasing input stage of embodiments of the present invention may be used to particular advantage for forming amplifiers. In that case, such an amplifier includes the adaptive biasing input stage and an output stage coupled between the adaptive biasing input stage and an output node for generating an output signal at the output node.

In an example embodiment of the present invention, the output stage includes first and second output field effect transistors. The first output field effect transistor is coupled between the second power supply node and the output node and is biased with one of the first and third current mirrors coupled to one of the sensing field effect transistors. The second output field effect transistor is coupled between the first power supply node and the output node and is biased with one of the second and fourth current mirrors coupled to such one of the sensing field effect transistors.

In another embodiment of the present invention, the output stage includes first and second output field effect transistors, a compensating resistor, and a compensating capacitor. The first output field effect transistor is coupled between the second power supply node and the output node and has a gate coupled to a drain of one of the amplifying field effect transistors, with an active load being coupled to the drain of such one of the amplifying field effect transistors. The compensating resistor and the compensating capacitor are coupled in series between the gate of the first output field effect transistor and the output node. The second output field effect transistor is coupled between the first power supply node and the output node and is biased with one of the second and fourth current mirrors coupled to one of the sensing field effect transistors having a same one of the differential inputs applied thereon as such one of the amplifying field effect transistors.

The adaptive biasing input stage of embodiments of the present invention may also be used to particular advantage for forming rail-to-rail amplifiers. In that case, such a rail-to-rail amplifier includes first and second adaptive biasing input stages, each implemented according to above described embodiments of the present invention and includes an output stage.

The first adaptive biasing input stage receives differential inputs to generate a first intermediate signal to the output stage, and the second adaptive biasing input stage receives the differential inputs to generate a second intermediate signal to the output stage. In addition, respective field effect transistors of the first and second adaptive biasing input stages are mirror complements of each-other as P-type versus N-type field effect transistors.

In this manner, the adaptive biasing input stage is formed with relatively few current mirrors, a single static current source, and without a series of multiple diode-connected field effect transistors. Thus, the adaptive biasing input stage occupies a small area, has high current efficiency, and high operating voltage range.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, and 9 refer to elements having similar structure and/or function.

DETAILED DESCRIPTION

Figure 1:
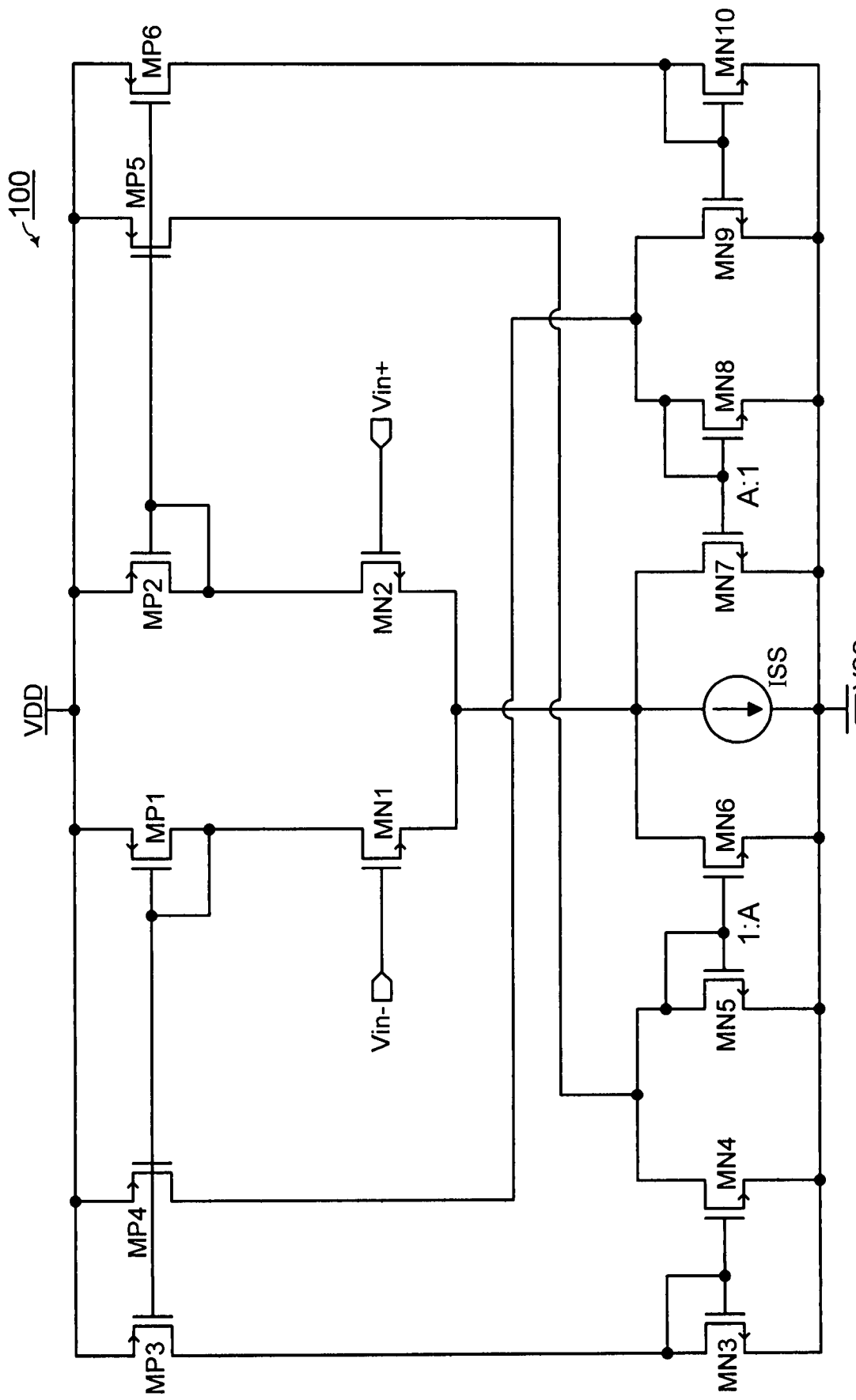
FIGS. 1 and 2 show circuit diagrams of adaptive biasing amplifiers according to the prior art.
Figure 2:
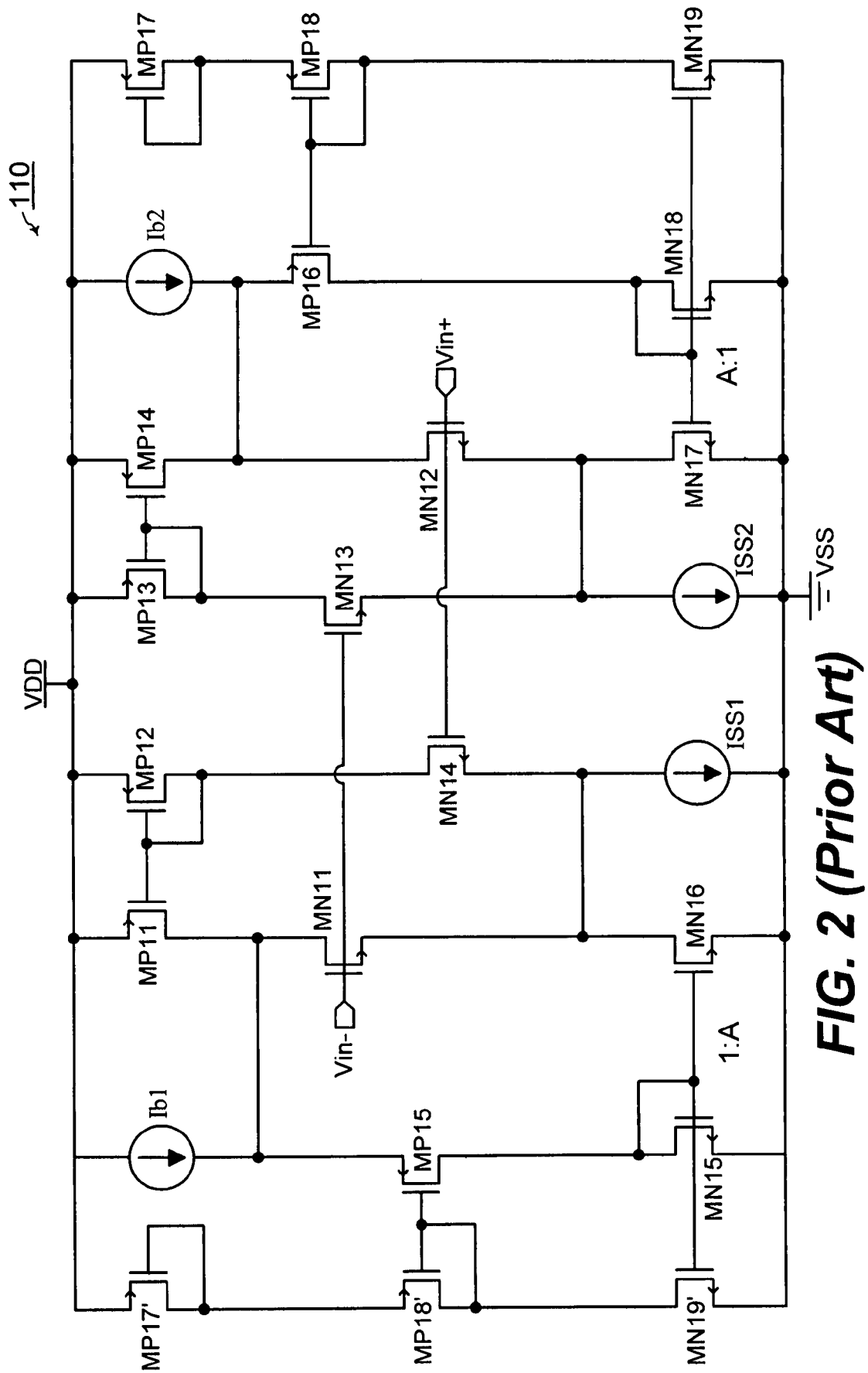
Figure 3:
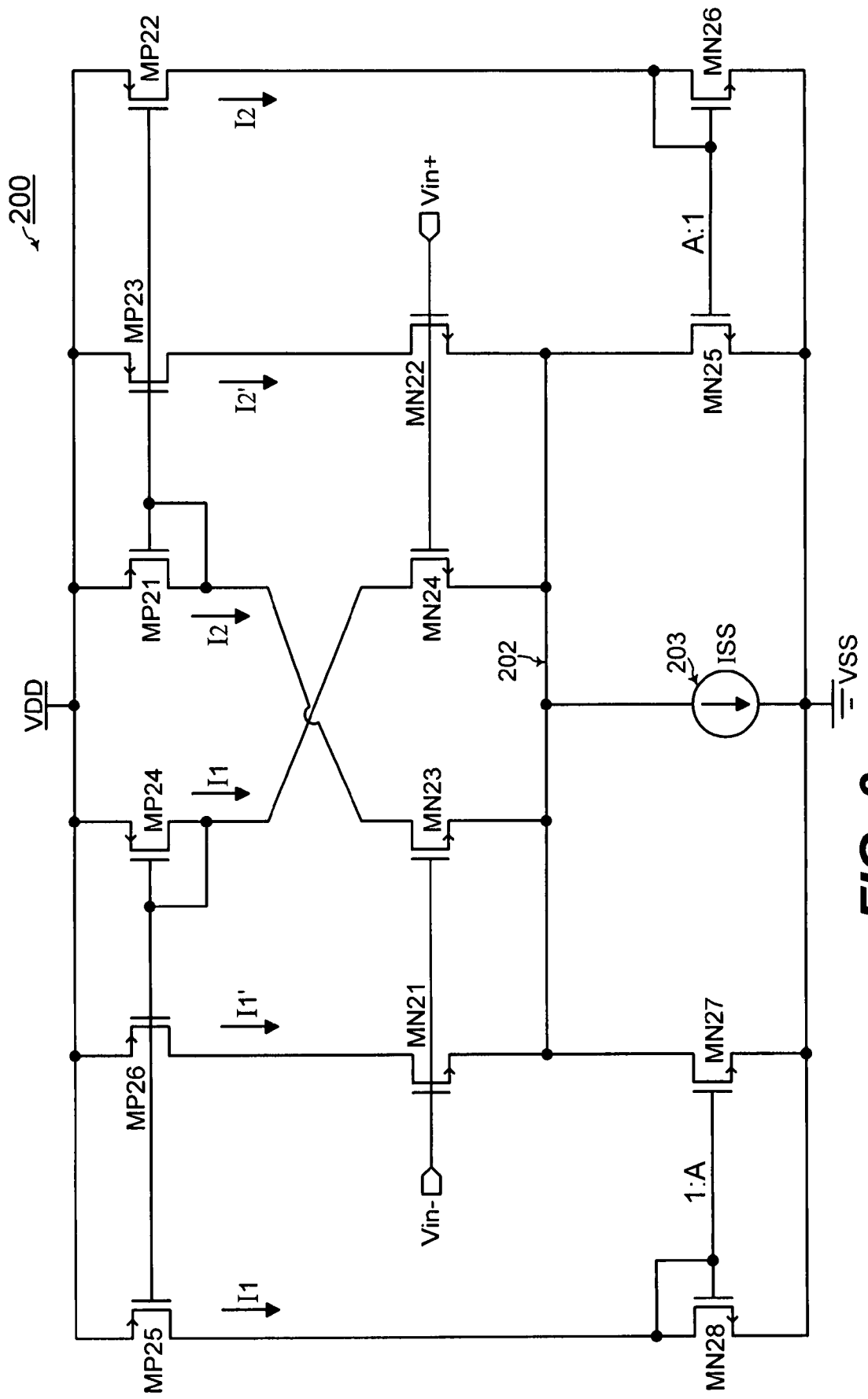
FIG. 3 shows an adaptive biasing input stage according to an embodiment of the present invention.

FIG. 3 shows a circuit diagram of an adaptive input stage 200 according to an embodiment of the present invention. Referring to FIG. 3, the adaptive input stage 200 includes a pair of differentially coupled amplifying NMOSFETs (N-channel metal oxide semiconductor field effect transistors) MN21 and MN22. In addition, the adaptive input stage 200 includes a pair of differentially coupled sensing NMOSFETs MN23 and MN24.

A static current source 203 is coupled to sources of the amplifying and sensing NMOSFETs MN21, MN22, MN23, and MN24 at a predetermined node 202. In addition, the static current source 203 is coupled to a first power supply node that provides a low supply voltage VSS which may be the ground voltage. The gate of the amplifying NMOSFET MN21 and the gate of the sensing NMOSFET MN23 have a first input Vin− applied thereon. The gate of the amplifying NMOSFET MN222 and the gate of the sensing NMOSFET MN24 have a second input Vin+ applied thereon. The first and second inputs Vin− and Vin+ are differential inputs in an embodiment of the present invention.

A first current mirror is formed by a pair of PMOSFETs (P-channel metal oxide semiconductor field effect transistors) MP21 and MP22. The PMOSFET MP21 is diode-connected between a second power supply node that provides a high supply voltage VDD and a drain of the sensing NMOSFET MN23. The PMOSFET MP22 has a source coupled to the second power supply node VDD and has a gate coupled to the gate of the PMOSFET MP21. A load PMOSFET MP23 has a gate coupled to the gate of the PMOSFET MP21, has a source coupled to the second power supply node VDD, and has a drain coupled to the drain of the amplifying NMOSFET MN22.

A second current mirror is formed by a pair of NMOSFETs MN25 and MN26 coupled between the PMOSFET MP22 of the first current mirror, the predetermined node 202, and the first power supply node VSS. The NMOSFET MN26 is diode-connected between the first power supply node VSS and a drain of the PMOSFET MP22. The NMOSFET MN25 has a source coupled to the first power supply node VSS, has a gate coupled to the gate of the NMOSFET MN26, and has a drain coupled to the predetermined node 202.

A third current mirror is formed by a pair of PMOSFETs MP24 and MP25. The PMOSFET MP24 is diode-connected between the second power supply node VDD and a drain of the sensing NMOSFET MN24. The PMOSFET MP25 has a source coupled to the second power supply node VDD and has a gate coupled to the gate of the PMOSFET MP24. A load PMOSFET MP26 has a gate coupled to the gate of the PMOSFET MP24, has a source coupled to the second power supply node VDD, and has a drain coupled to the drain of the amplifying NMOSFET MN21.

A fourth current mirror is formed by a pair of NMOSFETs MN27 and MN28 coupled between the PMOSFET MP25 of the third current mirror, the predetermined node 202, and the first power supply node VSS. The NMOSFET MN28 is diode-connected between the first power supply node VSS and a drain of the PMOSFET MP25. The NMOSFET MN27 has a source coupled to the first power supply node VSS, has a gate coupled to the gate of the NMOSFET MN28, and has a drain coupled to the predetermined node 202.

The NMOSFET MN26 is a first mirror transistor having a first area, and the NMOSFET MN25 is a second mirror transistor having a second area that is A-times the first area of the NMOSFET MN26. The NMOSFET MN28 is a third mirror transistor having a third area, and the NMOSFET MN27 is a fourth mirror transistor having a fourth area that is A-times the third area of the NMOSFET MN28.

In an embodiment of the present invention, the PMOSFETs MP21, MP22, MP23, MP24, MP25, and MP26 are equally sized. In addition, the NMOSFETs MN21, MN22, MN23, and MN24 are fabricated to be matched according to an embodiment of the present invention.

Figure 4:
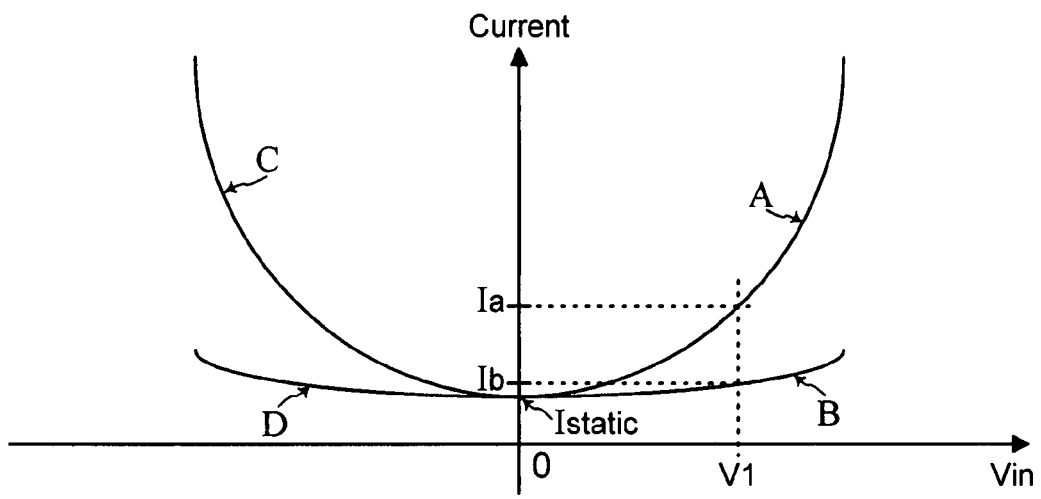
FIG. 4 shows a dynamic current characteristic of the adaptive biasing input stage of FIG. 3 according to an embodiment of the present invention.

Operation of the adaptive input stage 200 of FIG. 3 is now described with reference to a dynamic current characteristic as illustrated in FIG. 4. However, operation of the adaptive input stage 200 during a static state is first described. During the static state, Vin=0 when Vin+=Vin−=Vin,cm, with Vin,cm being a common mode voltage of the inputs Vin+ and Vin−. In that case, I1,static=I2,static=I1',static=I2',static=Istatic; with I1,static being a static current for I1; I2,static being a static current for I2; I1',static being a static current for I1'; and I2',static being a static current for I2', during the static operation for the adaptive input stage 200 of FIG. 3.

In that case, Istatic is expressed as follows in Equation 1 below:

$$I_{static} = \begin{cases} \frac{I_{SS}}{2(2-A)} & 0 \leq A < 2 \\ \infty & 2 \leq A \end{cases} \quad \text{[Equation 1]}$$

ISS is the level of the static current provided by the static current source 203, and A is the ratio of the areas of the NMOSFETs MN25 and MN26 or of the NMOSFETs MN27 and MN28. When A≧2, the static current Istatic does not reach infinity but rather saturation results.

Next, operation of the adaptive input stage 200 during a dynamic state is described. During the dynamic state, Vin≠0 with Vin=Vin+−Vin−. Assuming that the MOSFETs of FIG. 3 operate in strong inversion, the Istatic component of the currents I1, I1', I2, and I2' is expressed as follows in Equation 2 below:

$$I_{static} = \frac{K}{2}(V_{in,cm} - V_{x,static} - V_{thn})^2 \qquad \text{[Equation 2]}$$

K=μn*Cox*(W/L), with μn being the electron mobility, Cox being a capacitance per unit area, and W/L being the width to length ratio of each of the NMOSFETs MN21, MN22, MN23, and MN24. In addition, Vx,static is a voltage at the predetermined node 202 during the static state, and Vthn is the threshold voltage of each of the NMOSFETs MN21, MN22, MN23, and MN24. Equation 2 may then also be expressed as Equation 3 below:

$$V_{in,cm} - V_{x,static} - V_{thn} = \sqrt{\frac{2I_{static}}{K}} \qquad \text{[Equation 3]}$$

Furthermore, Vx which is the voltage at the predetermined node 202 may be approximated to Equation 4 below:

$$V_x \approx V_{x,static} - \alpha|V_{in}| (\alpha \approx \sqrt{A}) \qquad \text{[Equation 4]}$$

If Vin>0 when Vin+>Vin− during the dynamic state, then I1,dynamic is expressed as Equation 5 below:

$$\begin{aligned}I_{1,dynamic} &= \frac{K}{2}(V_{in+} - V_X - V_{thn})^2 \qquad \text{[Equation 5]}\\ &= \frac{K}{2}\left(V_{in,cm} + \frac{V_{in}}{2} - V_{X,static} + \alpha|V_{in}| - V_{thn}\right)^2\\ &= \frac{K}{2}\left\{\left(\alpha + \frac{1}{2}\right)V_{in} + \sqrt{\frac{2I_{static}}{K}}\right\}^2\end{aligned}$$

Such I1,dynamic is illustrated by a quadratic function A versus Vin in FIG. 4. When Vin>0, a large amount of dynamic current I1,dynamic flows from the current loop formed by MOSFETs MN24, MP24, MP25, MN28, and MN27. Thus, the current mirrors formed by MOSFETs MN28, MN27, MP24 and MP25 increase the current flowing through the predetermined node 202 when Vin>0.

In addition in that case, I2,dynamic, I1',dynamic, and I2', dynamic are expressed as Equation 6 below:

$$\begin{aligned}I_{2,dynamic} &= \frac{K}{2}(V_{in-} - V_X - V_{thn})^2 \qquad \text{[Equation 6]}\\ &= \frac{K}{2}\left(V_{in,cm} - \frac{V_{in}}{2} - V_{X,static} + \alpha|V_{in}| - V_{thn}\right)^2\\ &= \frac{K}{2}\left\{\left(\alpha - \frac{1}{2}\right)V_{in} + \sqrt{\frac{2I_{static}}{K}}\right\}^2 = I_{1',dynamic}\\ &= I_{2',dynamic}\end{aligned}$$

Such I2,dynamic, I1',dynamic, and I2',dynamic are illustrated by current characteristic B versus Vin in FIG. 4.

If Vin<0 when Vin+<Vin− during the dynamic state, then I1,dynamic, I1',dynamic, and I2',dynamic are expressed as Equation 7 below:

$$\begin{aligned}I_{1,dynamic} &= \frac{K}{2}(V_{in+} - V_X - V_{thn})^2 \qquad \text{[Equation 7]}\\ &= \frac{K}{2}\left\{\left(\alpha - \frac{1}{2}\right)V_{in} - \sqrt{\frac{2I_{static}}{K}}\right\}^2\\ &= I_{1',dynamic} = I_{2',dynamic}\end{aligned}$$

Such I1,dynamic, I1',dynamic, and I2',dynamic are illustrated by current characteristic D versus Vin in FIG. 4.

Also in that case, I2,dynamic is expressed as Equation 8 below:

$$\begin{aligned}I_{2,dynamic} &= \frac{K}{2}(V_{in-} - V_X - V_{thn})^2 \qquad \text{[Equation 8]}\\ &= \frac{K}{2}\left\{\left(\alpha + \frac{1}{2}\right)V_{in} - \sqrt{\frac{2I_{static}}{K}}\right\}^2\end{aligned}$$

Such I2,dynamic is illustrated by a quadratic function C versus Vin in FIG. 4. When Vin<0, a large amount of dynamic current I2,dynamic flows from the current loop formed by MOSFETs MN23, MP21, MP22, MN26, and MN25. Thus, the current mirrors formed by MOSFETs MN23, MP21, MP22, MN26, and MN25 increase the current flowing through the predetermined node 202 when Vin<0.

Additionally, FIG. 4 shows that at an example Vin=V1, I1,dynamic=Ia, and I2,dynamic=Ib. In that case, (A−1)Ia+(A−3)Ib+ISS>0 which approximates to (A−1)Ia≧0 because Ib is much less than Ia. Thus, the value of A (which is the area ratio for the NMOSFETs MN25 and MN26 or for the NMOSFETs MN27 and MN28) that satisfies the dynamic characteristic has the range of A≧1. Such a dynamic characteristic of A≧1 results in providing large dynamic currents I1,dynamic or I2,dynamic when Vin≠0 in the dynamic state. Also given Equation 1 above, for simultaneously satisfying both the static condition of maintaining a small static current and the dynamic condition of a fast slew rate, A is desired to be in the range of 1≦A<2.

Figure 5:
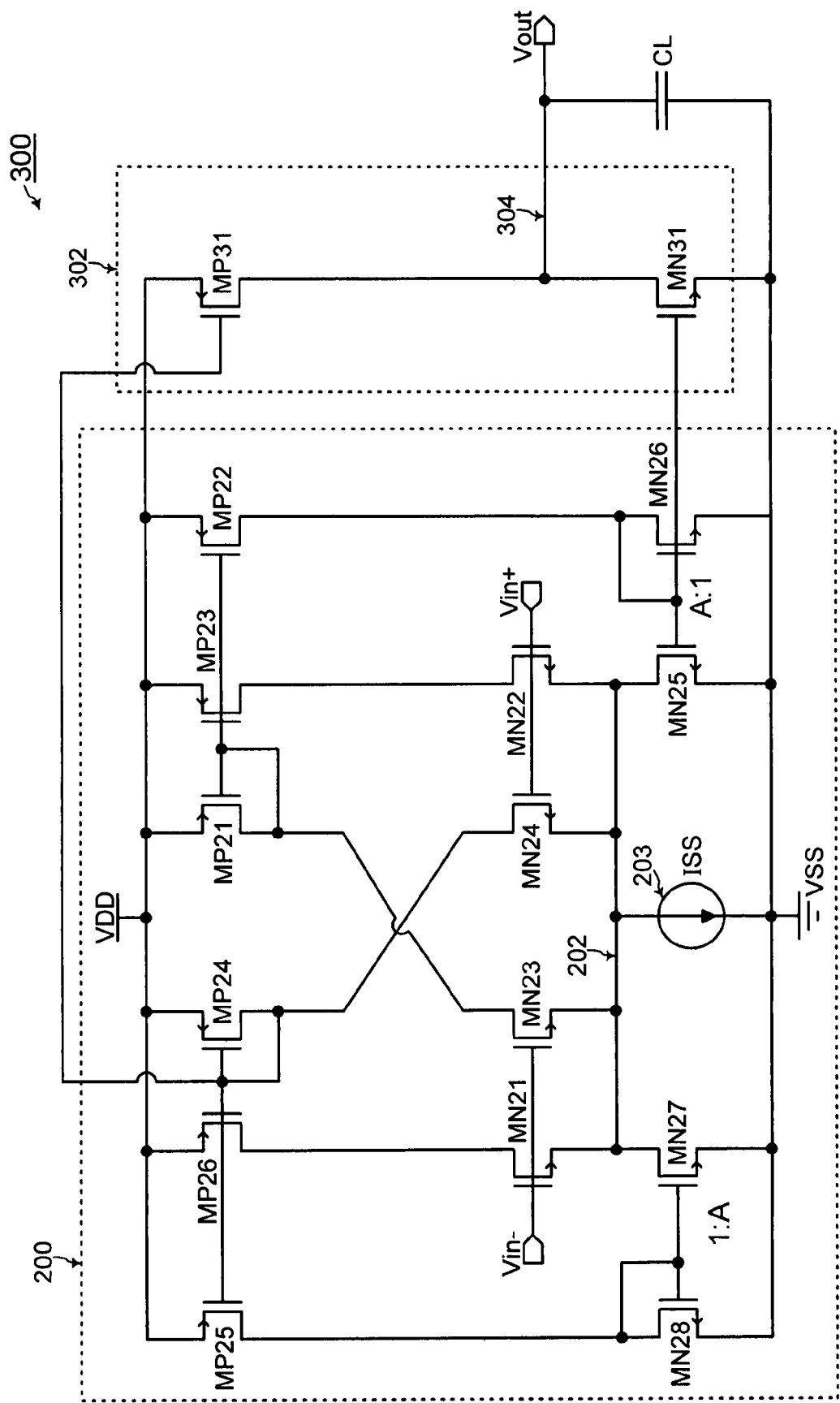
FIG. 5 shows a circuit diagram of an adaptive biasing amplifier advantageous for high load capacitance and having the adaptive biasing input stage of FIG. 3 according to an embodiment of the present invention.

FIG. 5 shows an amplifier 300 formed with the adaptive input stage 200 of FIG. 3 according to an embodiment of the present invention. Elements having the same reference number in FIGS. 3 and 5 refer to elements having similar structure and/or function. The amplifier 300 includes the adaptive input stage 200 and an output stage 302 coupled between the adaptive input stage 200 and an output node 304.

The output stage 302 includes an output PMOSFET MP31 having a source coupled to the second power supply node VDD, a gate coupled to the gate of the PMOSFET MP24, and a drain coupled to the output node 304. The output stage 302 also includes an output NMOSFET MN31 having a source coupled to the first power supply node VSS, a gate coupled to the gate of the NMOSFET MN26, and a drain coupled to the output node 304. A load capacitor CL is coupled between the output node 304 and the first power supply node VSS.

Furthermore, the area ratio A may be optimized for maximizing current efficiency (CE) of the adaptive biasing amplifier 300 of FIG. 5. CE is expressed as Equation 9 below:

$$CE = I_{load,dynamic}/I_{total} = SR \times C_L/I_{total} \qquad \text{[Equation 9]}$$

Itotal is the total quiescent current in the adaptive biasing amplifier 300 and SR is the slew rate for charging or discharging the load capacitor CL.

Iload,dynamic which is the dynamic current to the load capacitor CL is expressed as Equation 10 below:

$$I_{load,dynamic} = I_{1,dynamic} - I_{2,dynamic} = \pm \sqrt{K}(\alpha \sqrt{K V_{in}^2 + 2I_{static}|V_{in}|})$$ [Equation 10]

The plus sign for the Iload,dynamic in Equation 10 is for a current charging the load capacitor CL when Vin>0, and the minus sign is for the current discharging the load capacitor CL when Vin<0. The slew rate SR is expressed as Equation 11 below:

$$SR = \frac{\pm \sqrt{K}(\alpha \sqrt{K} V_{in}^2 + 2I_{static}|V_{in}|)}{C_L}$$ [Equation 11]

Figure 6:
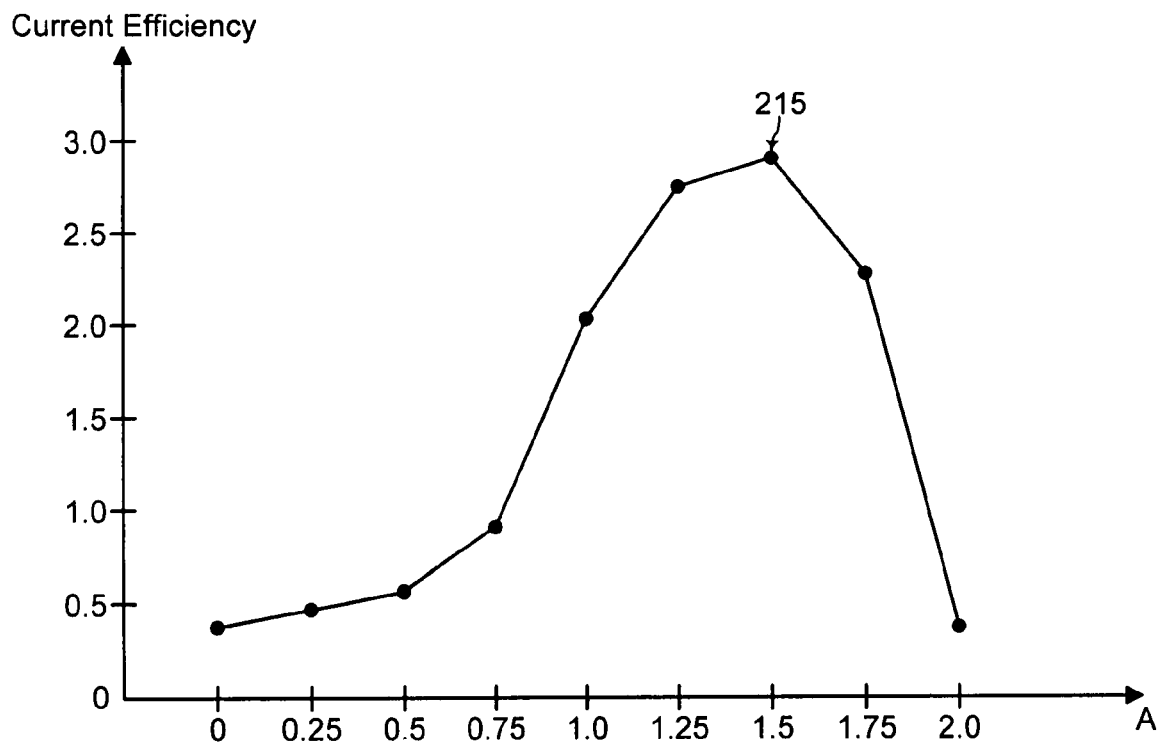
FIG. 6 shows a plot of current efficiency versus area ratio of mirror field effect transistors in the adaptive biasing amplifier of FIG. 5, according to an embodiment of the present invention.

The CE versus A may be plotted as illustrated in FIG. 6 and analyzed for determining an optimum area ratio A=1.5 at point 215 in FIG. 6 when the current efficiency CE is maximized.

The adaptive biasing amplifier 300 of FIG. 5 is advantageous for the case of a large capacitance of the load capacitor CL or for the case of a variable capacitance of the load capacitor CL. Sufficient phase margin may be obtained with the adaptive biasing amplifier 300 of FIG. 5. However, the adaptive biasing amplifier 300 of FIG. 5 may have relatively low gain.

Figure 7:
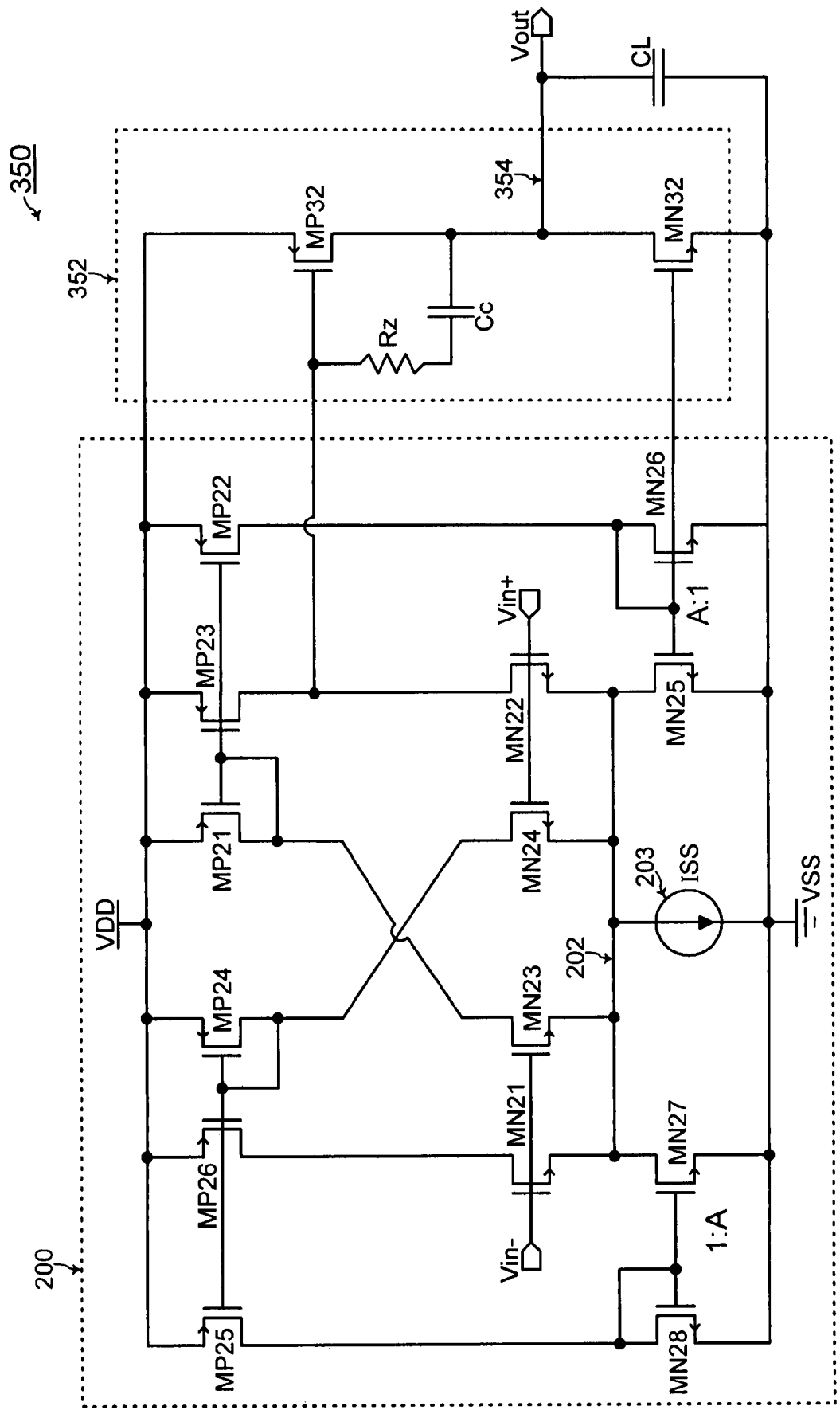
FIG. 7 shows a circuit diagram of an adaptive biasing amplifier advantageous for high gain bandwidth and having the adaptive biasing input stage of FIG. 3, according to another embodiment of the present invention.

FIG. 7 shows a circuit diagram of an adaptive biasing amplifier 350 having relatively high gain and formed with the adaptive input stage 200 of FIG. 3 according to another embodiment of the present invention. Elements having the same reference number in FIGS. 3 and 7 refer to elements having similar structure and/or function. The amplifier 350 includes the adaptive input stage 200 and an output stage 352 coupled between the adaptive input stage 200 and an output node 354.

The output stage 352 includes an output PMOSFET MP32 having a source coupled to the second power supply node VDD, a gate coupled to the drain of the NMOSFET MN22, and a drain coupled to the output node 354. The output stage 352 also includes an output NMOSFET MN32 having a source coupled to the first power supply node VSS, a gate coupled to the gate of the NMOSFET MN26, and a drain coupled to the output node 354. A load capacitor CL is coupled between the output node 354 and the first power supply node VSS.

In addition, the output stage 352 includes a compensating resistor Rz and a compensating capacitor Cc coupled in series between the gate of PMOSFET MP32 and the output node 354. The adaptive biasing amplifier 350 of FIG. 7 provides relatively high gain and high GBW (gain bandwidth) and is advantageous when the load capacitor CL has relatively low capacitance.

Figure 8:
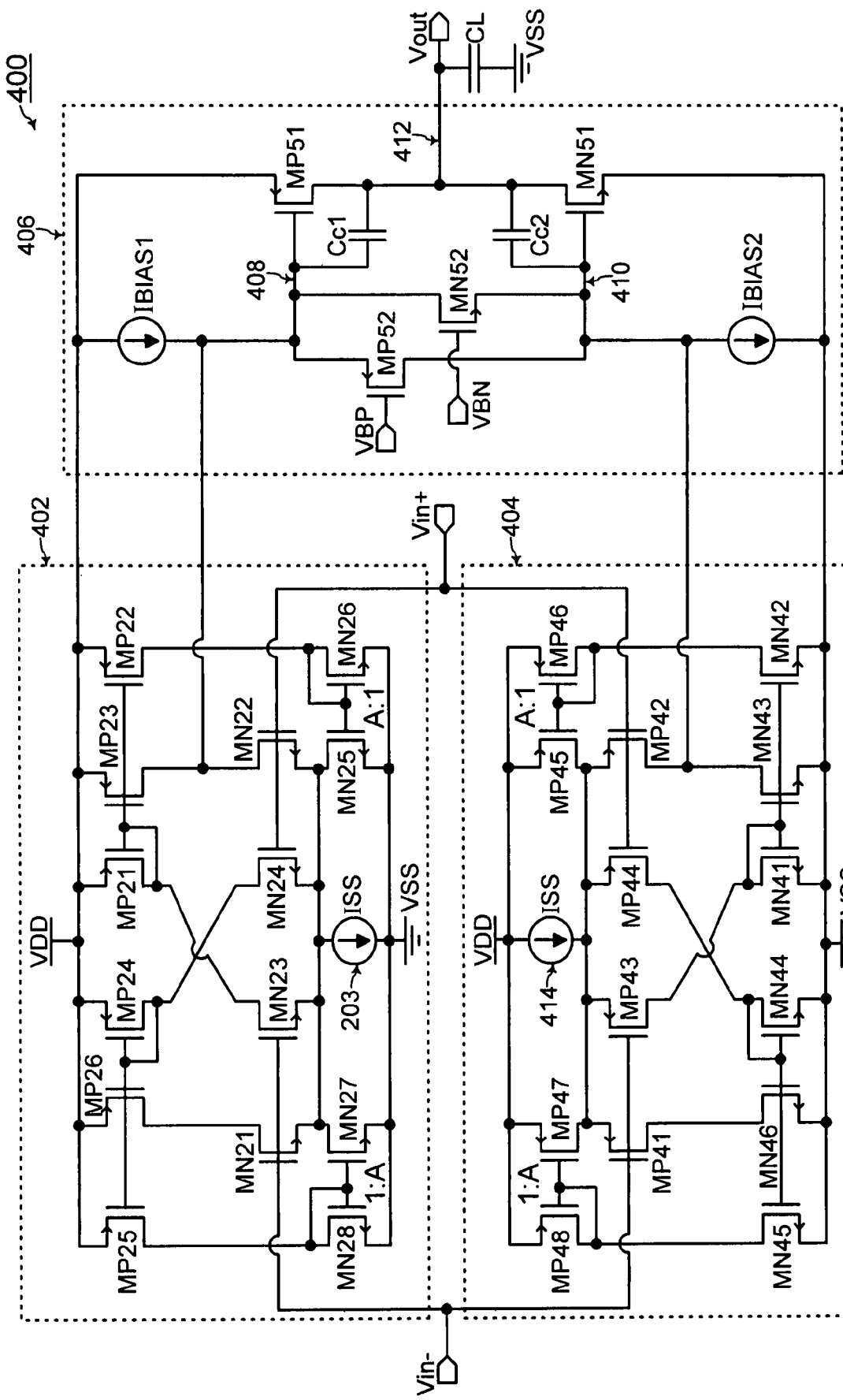
FIGS. 8 and 9 show circuit diagrams of rail-to-rail adaptive biasing amplifiers each having adaptive biasing input stages, according to an embodiment of the present invention.

FIG. 8 shows a circuit diagram of an adaptive biasing rail-to-rail amplifier 400 according to another embodiment of the present invention. The rail-to-rail amplifier 400 includes a first adaptive biasing input stage 402, a second adaptive biasing input stage 404, and an output stage 406.

The first adaptive biasing input stage 402 receives the differential inputs Vin+ and Vin− to generate a first intermediate signal at a first intermediate node 408. The second adaptive biasing input stage 404 receives the differential inputs Vin+ and Vin− to generate a second intermediate signal at a second intermediate node 410. The output stage 406 receives the first and second intermediate signals at the first and second intermediate nodes 408 and 410 to generate an output signal Vout at an output node 412.

The first adaptive biasing input stage 402 is implemented similarly to the adaptive biasing input stage 200 of FIG. 3 with elements having the same reference number in FIGS. 3 and 8 referring to elements having similar structure and/or function. In addition, the second adaptive biasing input stage 404 includes MOSFETs that are mirror complements of the MOSFETs of the first adaptive biasing input stage 402.

Thus, the second adaptive biasing input stage 404 includes NMOSFETs MN45, MN46, MN44, MN41, MN43, and MN42 that are configured as mirror complements of the PMOSFETs MP25, MP26, MP24, MP21, MP23, and MP22, respectively, of the first adaptive biasing input stage 402. In addition, the second adaptive biasing input stage 404 includes PMOSFETs MP48, MP47, MP45, MP46, MP41, MP43, MP44, and MP42 that are configured as mirror complements of the NMOSFETs MN28, MN27, MN25, MN26, MN21, MN23, MN24, and MN22, respectively, of the first adaptive biasing input stage 402. The second adaptive biasing input stage 404 includes a respective static current source 414 that is configured as a mirror complement of the respective static current source 203 of the first adaptive biasing input stage 402.

The output stage 406 includes a first bias current source IBIAS1 coupled between the second power supply node VDD and the first intermediate node 408 that is coupled to the drain of the NMOSFET MN22. The output stage 406 also includes a second bias current source IBIAS2 coupled between the first power supply node VSS and the second intermediate node 410 that is coupled to the drain of the PMOSFET MP42. The bias current sources IBIAS1 and IBIAS2 provide equal currents according to one embodiment of the present invention.

The output stage 406 further includes a first output PMOSFET MP51 having a source coupled to the second power supply node VDD, a gate coupled to the first intermediate node 408, and a drain coupled to the output node 412. A first compensating capacitor Cc1 is coupled between the gate and the drain of the PMOSFET MP51.

The output stage 406 also includes a first output NMOSFET MN51 having a source coupled to the first power supply node VSS, a gate coupled to the second intermediate node 410, and a drain coupled to the output node 412. A second compensating capacitor Cc2 is coupled between the gate and the drain of the NMOSFET MN51. The compensating capacitors Cc1 and Cc2 have equal capacitances according to one embodiment of the present invention.

The output stage 406 further includes a second output PMOSFET MP52 having a source coupled to the first intermediate node 408, a gate having a first bias voltage VBP applied thereon, and a drain coupled to the second intermediate node 410. The output stage 406 also includes a second output NMOSFET MN52 having a drain coupled to the first intermediate node 408, a gate having a second bias voltage VBN applied thereon, and a source coupled to the second intermediate node 410.

The first and second adaptive biasing input stages 402 and 404 operate similarly to the adaptive biasing input stage 200 of FIG. 3. By having both the first and second adaptive biasing input stages 402 and 404 that are configured as mirror complements, the rail-to-rail amplifier 400 operates for each of the inputs Vin+ and Vin− being in the rail-to-rail range of VDD to VSS.

Figure 9:
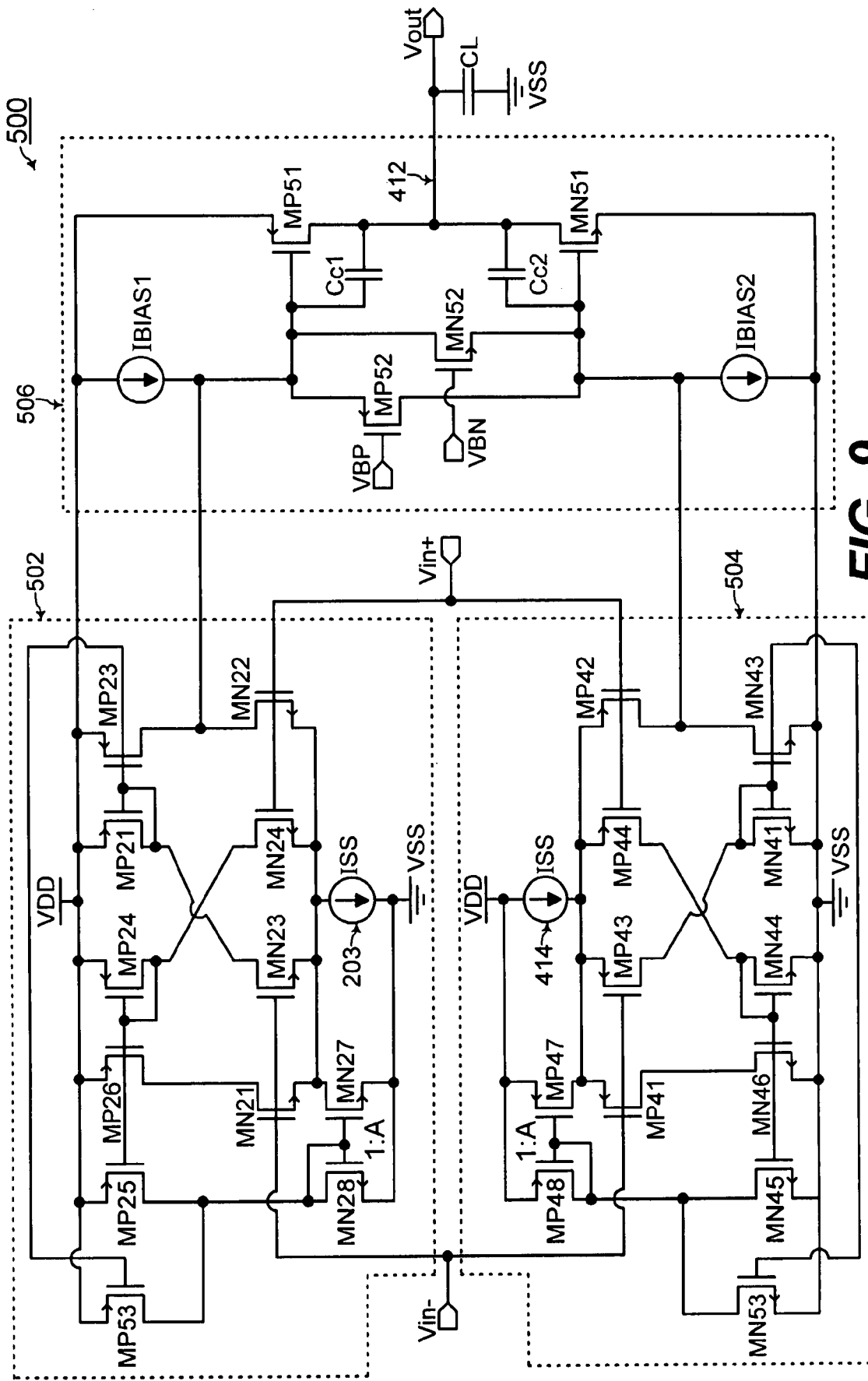

FIG. 9 shows a circuit diagram of an adaptive biasing rail-to-rail amplifier 500 with further minimization of the number of components according to another embodiment of the present invention. The rail-to-rail amplifier 500 includes a first adaptive biasing input stage 502, a second adaptive biasing input stage 504, and an output stage 506. The output stage 506 of FIG. 9 is implemented similarly to the output stage 406 of FIG. 8.

In addition, the first adaptive biasing input stage 502 of FIG. 9 is implemented similarly to the first adaptive biasing input stage 402 of FIG. 8. However, the PMOSFET MP22 and the current mirror formed by the NMOSFETs MN25 and MN26 in the first adaptive biasing input stage 402 of FIG. 8 are eliminated in the first adaptive biasing input stage 502 of FIG. 9. Rather, the first adaptive biasing input stage 502 of FIG. 9 includes a mirroring PMOSFET MP53 having a source coupled to the second power supply node VDD, a gate coupled to the gate of the PMOSFET MP21, and a drain coupled to the drain of the PMOSFET MP25.

Similarly, the second adaptive biasing input stage 504 of FIG. 9 is implemented similarly to the second adaptive biasing input stage 404 of FIG. 8. However, the NMOSFET MP42 and the current mirror formed by the PMOSFETs MP45 and MP46 in the second adaptive biasing input stage 404 of FIG. 8 are eliminated in the second adaptive biasing input stage 504 of FIG. 9. Rather, the second adaptive biasing input stage 504 of FIG. 9 includes a mirroring NMOSFET MN53 having a source coupled to the first power supply node VSS, a gate coupled to the gate of the NMOSFET MN41, and a drain coupled to the drain of the NMOSFET MN45.

In FIG. 9, by having both the first and second adaptive biasing input stages 502 and 504 that are configured as mirror complements, the rail-to-rail amplifier 500 operates for each of the inputs Vin+ and Vin− being in the rail-to-rail range of VDD to VSS. In addition, the rail-to-rail amplifier 500 of FIG. 9 is implemented with less MOSFETs in the first and second adaptive biasing input stages 502 and 504 than the rail-to-rail amplifier 400 of FIG. 8. Thus, the rail-to-rail amplifier 500 of FIG. 9 advantageously has minimized integrated circuit area.

In this manner, the adaptive biasing input stage 200 of FIG. 3 and the amplifiers 300, 350, 400, and 500 of FIGS. 5, 7, 8, and 9 including such an adaptive biasing input stage has high current efficiency with a minimized number of current sources and current mirrors. Thus, such integrated circuits operate with minimized power consumption and integrated circuit area.

The foregoing is by way of example only and is not intended to be limiting. Thus, any number of elements as illustrated and described herein is by way of example only. In addition, the adaptive biasing input stage 200 of FIG. 3 may be used for implementing other types of amplifiers aside from the examples of FIGS. 5, 7, 8, and 9.

The present invention is limited only as defined in the following claims and equivalents thereof.

The invention claimed is:

1. An adaptive biasing input stage, comprising:
   a pair of differentially coupled amplifying field effect transistors having gates with differential inputs applied thereon;
   a pair of differentially coupled sensing field effect transistors having gates with the differential inputs applied thereon;
   a static current source coupled between a first power supply node and sources of the amplifying and sensing field effect transistors at a predetermined node;
   a first current mirror coupled between one of the sensing field effect transistors and a second power supply node; and
   a second current mirror coupled between the first current mirror, the predetermined node, and the first power supply node.

2. The adaptive biasing input stage of claim 1, wherein the sensing field effect transistors and the first and second current mirrors increase a current flowing from the predetermined node when a first differential input applied on said one of the sensing field effect transistors is greater than a second differential input applied on another of the sensing field effect transistors.

3. The adaptive biasing input stage of claim 1, wherein the second current mirror includes a first mirror transistor having a first area and being coupled to the first current mirror, and includes a second mirror transistor having a second area that is A-times the first area and being coupled to the predetermined node.

4. The adaptive biasing input stage of claim 3, wherein A is between a range of from about 1 to about 2, and wherein A is selected to maximize current efficiency of the adaptive biasing input stage.

5. The adaptive biasing input stage of claim 3, further comprising:
   a third current mirror coupled between another of the sensing field effect transistors and the second power supply node; and
   a fourth current mirror coupled between the third current mirror, the predetermined node, and the first power supply node;
   wherein the sensing field effect transistors and the third and fourth current mirrors increase a current flowing from the predetermined node when a first differential input applied on the other of the sensing field effect transistors is greater than a second differential input applied on said one of the sensing field effect transistors;
   and wherein the fourth current mirror includes a third mirror transistor having a third area and being coupled to the third current mirror, and includes a fourth mirror transistor having a fourth area that is A-times the third area and being coupled to the predetermined node.

6. The adaptive biasing input stage of claim 5, wherein A is between a range of from about 1 to about 2, and wherein A is selected to maximize current efficiency of the adaptive biasing input stage.

7. The adaptive biasing input stage of claim 5, wherein a static current through each field effect transistor of the adaptive biasing input stage increases with A, and wherein a respective dynamic current through each of the amplifying and sensing field effect transistors is a respective quadratic function of a difference between the differential inputs.

8. The adaptive biasing input stage of claim 6, further comprising:
   load field effect transistors coupled between the amplifying field effect transistors and the second power supply node and being biased by the first and third current mirrors.

9. An amplifier comprising:
   a adaptive biasing input stage including:
   a pair of differentially coupled amplifying field effect transistors having gates with differential inputs applied thereon;
   a pair of differentially coupled sensing field effect transistors having gates with the differential inputs applied thereon;
   a static current source coupled between a first power supply node and sources of the amplifying and sensing field effect transistors at a predetermined node;

a first current mirror coupled between one of the sensing field effect transistors and a second power supply node;

a second current mirror coupled between the first current mirror, the predetermined node, and the first power supply node;

a third current mirror coupled between another of the sensing field effect transistors and the second power supply node; and a fourth current mirror coupled between the third current mirror, the predetermined node, and the first power supply node; and an output stage coupled between the adaptive biasing input stage and an output node for generating an output signal at the output node.

10. The amplifier of claim 9, wherein the output stage includes:

a first output field effect transistor coupled between the second power supply node and the output node and being biased with one of the first and third current mirrors coupled to one of the sensing field effect transistors; and a second output field effect transistor coupled between the first power supply node and the output node and being biased with one of the second and fourth current mirrors coupled to said one of the sensing field effect transistors.

11. The amplifier of claim 9, wherein the output stage includes:

a first output field effect transistor coupled between the second power supply node and the output node and having a gate coupled to a drain of one of the amplifying field effect transistors, with an active load being coupled to the drain of said one of the amplifying field effect transistors;

a compensating resistor and a compensating capacitor coupled in series between the gate of the first output field effect transistor and the output node; and a second output field effect transistor coupled between the first power supply node and the output node and being biased with one of the second and fourth current mirrors coupled to one of the sensing field effect transistors having a same one of the differential inputs applied thereon as said one of the amplifying field effect transistors;

wherein the sensing field effect transistors and the first and second current mirrors increase a current flowing from the predetermined node when a first differential input applied on said one of the sensing field effect transistors is greater than a second differential input applied on another of the sensing field effect transistors, and wherein the sensing field effect transistors and the third and fourth current mirrors increase a current flowing from the predetermined node when the second differential input applied on the other of the sensing field effect transistors is greater than the first differential input applied on said one of the sensing field effect transistors.

12. The amplifier of claim 9, wherein the second current mirror includes a first mirror transistor having a first area and being coupled to the first current mirror, and includes a second mirror transistor having a second area that is A-times the first area and being coupled to the predetermined node, and wherein the fourth current mirror includes a third mirror transistor having a third area and being coupled to the third current mirror, and includes a fourth mirror transistor having a fourth area that is A-times the third area and being coupled to the predetermined node.

13. The amplifier of claim 12, wherein A is between a range of from about 1 to about 2, and wherein A is selected to maximize current efficiency of the adaptive biasing input stage.

14. The amplifier of claim 12, wherein a static current through each field effect transistor of the adaptive biasing input stage increases with A, and wherein a respective dynamic current through each of the amplifying and sensing field effect transistors is a respective quadratic function of a difference between the differential inputs.

15. The amplifier of claim 9, further comprising:

load field effect transistors coupled between the amplifying field effect transistors and the second power supply node and being biased by the first and third current mirrors.

16. A rail-to-rail amplifier comprising:

an output stage;

a first adaptive biasing input stage that receives differential inputs to generate a first intermediate signal to the output stage; and a second adaptive biasing input stage that receives the differential inputs to generate a second intermediate signal to the output stage, wherein each of the first and second adaptive biasing input stages includes:

a pair of differentially coupled amplifying field effect transistors having gates with the differential inputs applied thereon;

a pair of differentially coupled sensing field effect transistors having gates with the differential inputs applied thereon;

a static current source coupled between a first power supply node and sources of the amplifying field effect transistors and the sensing field effect transistors at a predetermined node;

a first current mirror coupled between one of the sensing field effect transistors and a second power supply node; and a second current mirror coupled between the first current mirror, the predetermined node, and the first power supply node, wherein respective field effect transistors of the first and second adaptive biasing input stages are mirror complements of each-other as P-type versus N-type field effect transistors.

17. The rail-to-rail amplifier of claim 16, wherein each of the first and second adaptive biasing input stages further includes:

a third current mirror coupled between another of the sensing field effect transistors and the second power supply node; and a fourth current mirror coupled between the third current mirror, the predetermined node, and the first power supply node;

wherein a drain of one of the amplifying field effect transistors is coupled to an active load and generates one of the first and second intermediate signals;

and wherein the sensing field effect transistors and the first and second current mirrors increase a current flowing from the predetermined node when a first differential input applied on said one of the sensing field effect transistors is greater than a second differential input applied on another of the sensing field effect transistors, and wherein the sensing field effect transistors and the third and fourth current mirrors increase a current flowing from the predetermined node when the second differential input applied on the other of the sensing field effect transistors is greater than the first differential input applied on said one of the sensing field effect transistors.

18. The rail-to-rail amplifier of claim 16, wherein the second current mirror includes a first mirror transistor having a first area and being coupled to the first current mirror, and includes a second mirror transistor having a second area that is A-times the first area and being coupled to the predetermined node, and wherein the fourth current mirror includes a third mirror transistor having a third area and being coupled to the third current mirror, and includes a fourth mirror transistor having a fourth area that is A-times the third area and being coupled to the predetermined node.

19. The rail-to-rail amplifier of claim 18, wherein A is between a range of from about 1 to about 2, and wherein A is selected to maximize current efficiency of the adaptive biasing input stage.

20. The rail-to-rail amplifier of claim 18, wherein a static current through each field effect transistor of the adaptive biasing input stage increases with A, and wherein a respective dynamic current through each of the amplifying and sensing field effect transistors is a respective quadratic function of a difference between the differential inputs.

21. The rail-to-rail amplifier of claim 16, wherein a drain of one of the amplifying field effect transistors is coupled to an active load and generates one of the first and second intermediate signals, and has a gate with the same one of the differential inputs applied thereon as on said one of the sensing field effect transistors coupled to the first current mirror.

22. The rail-to-rail amplifier of claim 21, wherein each of the first and second adaptive biasing input stages includes:

a third current mirror coupled between the second power supply node, another of the sensing transistors, and the second current mirror; and a mirroring field effect transistor having a gate biased with the third current mirror and having a drain coupled between the first and second current mirrors;

wherein the sensing field effect transistors, the mirroring field effect transistor, and the first, second, and third current mirrors increase a current flowing from the predetermined node when the differential inputs are different.

23. The rail-to-rail amplifier of claim 16, wherein the second current mirror includes a first mirror transistor having a first area and being coupled to the first current mirror, and includes a second mirror transistor having a second area that is A-times the first area and being coupled to the predetermined node.

24. The rail-to-rail amplifier of claim 23, wherein A is between a range of from about 1 to about 2, and wherein A is selected to maximize current efficiency of the adaptive biasing input stage.

25. The rail-to-rail amplifier of claim 24, wherein a static current through each field effect transistor of the adaptive biasing input stage increases with A, and wherein a respective dynamic current through each of the amplifying and sensing field effect transistors is a respective quadratic function of a difference between the differential inputs.

* * * * *